(12) United States Patent
Foss et al.

(10) Patent No.: US 7,599,246 B2
(45) Date of Patent: *Oct. 6, 2009

(54) DELAY LOCKED LOOP IMPLEMENTATION IN A SYNCHRONOUS DYNAMIC RANDOM ACCESS MEMORY

(75) Inventors: Richard C. Foss, Calabogie, ON. (CA);
Peter B. Gillingham, Kanata (CA);
Graham Allan, Stittsville (CA)

(73) Assignee: MOSAID Technologies, Inc., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/195,257

(22) Filed: Aug. 1, 2005

(65) Prior Publication Data

US 2005/0265506 A1  Dec. 1, 2005

Related U.S. Application Data

(63) Continuation of application No. 10/645,330, filed on Aug. 21, 2003, now Pat. No. 6,992,950, which is a continuation of application No. 10/348,062, filed on Jan. 17, 2003, now Pat. No. 6,657,919, which is a continuation of application No. 10/279,217, filed on Oct. 23, 2002, now Pat. No. 6,657,918, which is a continuation of application No. 09/977,088, filed on Oct. 12, 2001, now abandoned, which is a continuation of application No. 09/761,274, filed on Jan. 16, 2001, now Pat. No. 6,314,052, which is a continuation of application No. 09/392,088, filed on Sep. 8, 1999, now Pat. No. 6,205,083, which is a continuation of application No. 08/996,095, filed on Dec. 22, 1997, now Pat. No. 6,067,272, which is a continuation of application No. 08/319,042, filed on Oct. 6, 1994, now Pat. No. 5,796,673.

(51) Int. Cl.
*G11C 11/34* (2006.01)
(52) U.S. Cl. .................. 365/233.5; 365/194
(58) Field of Classification Search ................. 365/233, 365/194, 233.5

See application file for complete search history.

(56) References Cited

U.S. PATENT DOCUMENTS 2,255,232 A  9/1941  Stern
(Continued)

FOREIGN PATENT DOCUMENTS

EP  0942430 A1  9/1999
(Continued)

OTHER PUBLICATIONS

Nakamura, Kazuyuki, et al., "A 220-MHz Pipelined 16-Mb BiCMOS SRAM with PLL Proportional Self-Timing Generator," *IEEE Journal of Solid-State Circuits*, vol. 29, No. 11, pp. 1317-1322(Nov. 1994).
(Continued)

*Primary Examiner*—Michael T Tran
(74) *Attorney, Agent, or Firm*—Hamilton, Brook, Smith & Reynolds, P.C.

(57) ABSTRACT

A clock applying circuit for a synchronous memory is comprised or a clock input for receiving a clock input signal, apparatus connected to the synchronous memory for receiving a driving clock signal, and a tapped delay line for receiving the clock input signal and for delivering the clock driving signal to the synchronous memory in synchronism with but delayed from the clock input signal, the delay being a small fraction of the clock period or the clock input signal.

22 Claims, 3 Drawing Sheets

U.S. PATENT DOCUMENTS

| | | | |
|---|---|---|---|
| 3,413,615 A | | 11/1968 | Botjer et al. |
| 3,676,711 A | | 7/1972 | Ahrons |
| 4,016,511 A | | 4/1977 | Ramsey et al. |
| 4,330,852 A | | 5/1982 | Redwine et al. |
| 4,338,569 A | | 7/1982 | Petrich |
| 4,463,440 A | | 7/1984 | Nishiura et al. |
| 4,496,861 A | | 1/1985 | Bazes |
| 4,506,164 A | | 3/1985 | Higuchi |
| 4,511,811 A | | 4/1985 | Gupta |
| 4,527,258 A | | 7/1985 | Guterman |
| 4,549,283 A | | 10/1985 | McDermott, II |
| 4,604,582 A | | 8/1986 | Strenkowski et al. |
| 4,623,805 A | | 11/1986 | Flora et al. |
| 4,636,930 A | | 1/1987 | Bingham et al. |
| 4,637,018 A | * | 1/1987 | Flora et al. ............... 714/700 |
| 4,638,182 A | | 1/1987 | McAdams |
| 4,673,829 A | | 6/1987 | Gupta |
| 4,754,164 A | | 6/1988 | Flora et al. |
| 4,755,704 A | | 7/1988 | Flora et al. |
| 4,757,469 A | | 7/1988 | Odijk |
| 4,782,247 A | | 11/1988 | Yoshida |
| 4,795,985 A | | 1/1989 | Gailbreath, Jr. |
| 4,845,437 A | | 7/1989 | Mansur et al. |
| 4,926,070 A | | 5/1990 | Tanaka et al. |
| 4,931,992 A | | 6/1990 | Ogihara et al. |
| 4,958,091 A | | 9/1990 | Roberts |
| 4,984,202 A | | 1/1991 | Kawahara et al. |
| 4,994,688 A | | 2/1991 | Horiguchi et al. |
| 5,029,136 A | | 7/1991 | Tran et al. |
| 5,093,807 A | | 3/1992 | Hashimoto et al. |
| 5,101,107 A | | 3/1992 | Stoot |
| 5,101,117 A | | 3/1992 | Johnson et al. |
| 5,109,394 A | | 4/1992 | Hjerpe et al. |
| 5,111,063 A | | 5/1992 | Iwata |
| 5,148,399 A | | 9/1992 | Cho et al. |
| 5,220,206 A | | 6/1993 | Tsang et al. |
| 5,223,755 A | * | 6/1993 | Richley ............... 327/158 |
| 5,243,703 A | | 9/1993 | Farmwald et al. |
| 5,245,231 A | * | 9/1993 | Kocis et al. ............... 327/277 |
| 5,247,469 A | * | 9/1993 | McCune, Jr. ............... 708/276 |
| 5,252,867 A | * | 10/1993 | Sorrells et al. ............... 327/152 |
| 5,272,390 A | | 12/1993 | Watson, Jr. et al. |
| 5,272,729 A | | 12/1993 | Bechade et al. |
| 5,287,319 A | | 2/1994 | Fukumoto |
| 5,287,327 A | | 2/1994 | Takasugi |
| 5,295,164 A | | 3/1994 | Yamamura |
| 5,311,483 A | * | 5/1994 | Takasugi ............... 365/233 |
| 5,317,202 A | | 5/1994 | Waizman |
| 5,319,755 A | | 6/1994 | Farmwald et al. |
| 5,337,285 A | | 8/1994 | Ware et al. |
| 5,371,764 A | | 12/1994 | Gillingham et al. |
| 5,384,735 A | | 1/1995 | Park et al. |
| 5,400,370 A | * | 3/1995 | Guo ............... 375/371 |
| 5,406,518 A | | 4/1995 | Sun et al. |
| 5,410,263 A | | 4/1995 | Waizman |
| 5,412,615 A | | 5/1995 | Noro et al. |
| 5,412,697 A | * | 5/1995 | Van Brunt et al. ............... 375/360 |
| 5,414,381 A | | 5/1995 | Nelson et al. |
| 5,432,823 A | | 7/1995 | Gasbarro et al. |
| 5,440,514 A | * | 8/1995 | Flannagan et al. ............... 365/194 |
| 5,440,515 A | | 8/1995 | Chang et al. |
| 5,444,203 A | | 8/1995 | Gunnarsson |
| 5,459,684 A | | 10/1995 | Nakamura et al. |
| 5,463,337 A | * | 10/1995 | Leonowich ............... 327/158 |
| 5,479,128 A | | 12/1995 | Jan et al. |
| 5,479,647 A | | 12/1995 | Harness et al. |
| 5,497,115 A | | 3/1996 | Millar et al. |
| 5,537,068 A | | 7/1996 | Konno |
| 5,544,203 A | | 8/1996 | Casasanta et al. |
| 5,553,276 A | | 9/1996 | Dean |
| 5,554,950 A | | 9/1996 | Molin |
| 5,570,054 A | | 10/1996 | Takla |
| 5,602,771 A | | 2/1997 | Kajigaya et al. |
| 5,604,775 A | | 2/1997 | Saitoh et al. |
| 5,610,543 A | | 3/1997 | Chang et al. |
| 5,614,855 A | | 3/1997 | Lee et al. |
| 5,619,541 A | | 4/1997 | Van Brunt et al. |
| 5,631,593 A | | 5/1997 | Molin |
| 5,631,866 A | | 5/1997 | Oka et al. |
| 5,648,931 A | | 7/1997 | Obara |
| 5,657,481 A | | 8/1997 | Farmwald et al. |
| 5,703,475 A | | 12/1997 | Lee et al. |
| 5,708,622 A | | 1/1998 | Ohtani et al. |
| 5,714,904 A | * | 2/1998 | Jeong ............... 327/407 |
| 5,729,766 A | | 3/1998 | Cohen |
| 5,734,292 A | | 3/1998 | Shirai et al. |
| 5,777,501 A | | 7/1998 | AbouSeido |
| 5,796,673 A | | 8/1998 | Foss et al. |
| 5,798,979 A | | 8/1998 | Toda et al. |
| 5,809,263 A | | 9/1998 | Farmwald et al. |
| 5,812,832 A | | 9/1998 | Horne et al. |
| 5,818,793 A | | 10/1998 | Toda et al. |
| 5,828,250 A | | 10/1998 | Konno |
| 5,835,956 A | | 11/1998 | Park et al. |
| 5,867,432 A | | 2/1999 | Toda |
| 5,880,624 A | | 3/1999 | Koyanagi et al. |
| 5,986,949 A | | 11/1999 | Toda |
| 5,986,968 A | | 11/1999 | Toda et al. |
| 5,991,226 A | | 11/1999 | Bhullar |
| 6,034,901 A | | 3/2000 | Toda |
| 6,067,272 A | | 5/2000 | Foss et al. |
| 6,067,592 A | | 5/2000 | Farmwald et al. |
| 6,087,868 A | | 7/2000 | Millar |
| 6,150,855 A | | 11/2000 | Marbot |
| 6,205,083 B1 | | 3/2001 | Foss et al. |
| 6,256,248 B1 | | 7/2001 | Leung |
| 6,279,116 B1 | | 8/2001 | Lee |
| 6,282,606 B1 | | 8/2001 | Holland |
| 6,310,821 B1 | | 10/2001 | Toda et al. |
| 6,314,052 B2 | | 11/2001 | Foss et al. |
| 6,327,318 B1 | | 12/2001 | Bhullar et al. |
| 6,449,685 B1 | | 9/2002 | Leung |
| 6,496,437 B2 | | 12/2002 | Leung |
| 6,510,101 B2 | | 1/2003 | Toda et al. |
| 6,510,503 B2 | | 1/2003 | Gillingham et al. |
| 6,639,869 B2 | | 10/2003 | Toda et al. |
| 6,657,918 B2 | | 12/2003 | Foss et al. |
| 6,657,919 B2 | * | 12/2003 | Foss et al. ............... 365/233 |
| 6,959,016 B1 | * | 10/2005 | Keeth et al. ............... 370/517 |
| 2002/0021617 A1 | | 2/2002 | Toda et al. |
| 2002/0067648 A1 | | 6/2002 | Lee |
| 2003/0117884 A1 | | 6/2003 | Toda et al. |
| 2004/0218429 A1 | * | 11/2004 | Shim ............... 365/194 |

FOREIGN PATENT DOCUMENTS

| | | |
|---|---|---|
| JP | 62020200 | 1/1987 |
| JP | 0214094 | 8/1990 |
| TW | 434545 | 5/2001 |
| TW | 466490 | 12/2001 |
| TW | 476960 | 2/2002 |
| WO | WO 00/25317 | 5/2000 |

OTHER PUBLICATIONS

Kushiyama, N., et al., "500 Mbyte/sec Data-Rate 512 Kbits × 9 Dram Using a Novel I/O Interface," 1992 Symposium on VLSI Circuits Digest of Technical Papers, pp. 66-67 (1992).

Kushiyama, Natsuki, et al., "A 500-Megabyte/s Data-Rate 4.5M Dram," *IEEE Journal of Solid-State Circuits*, vol. 28, No. 4, pp. 490-498 (Apr. 1993).

Nakamura, Kazuyuki, et al., "A 220MHz Pipelined 16Mb BiCMOS Sram with PLL Proportional Self-Timing Generator," IEEE International Solid-State Circuits Conference, Session 15, pp. 258-259, 200-201 & 312(Feb. 18, 1994).

Hatakeyama, Atsushi, et al., "A 256Mb SDRAM Using a Register-Controlled Digital DLL," Fujitsu Limited, Kawasaki, Japan.

Hatakeyama, Atsushi, et al., "A 256-Mb SDRAM Using a Register-Controlled Digital DLL," *IEEE Journal of Solid-State Circuits*, vol. 32, No. 11, pp. 1728-1734 (Nov. 1997).

Efendovich, Avner, et al., "Multifrequency Zero-Jitter Delay-Locked Loop," *IEEE Journal of Solid-State Circuits*, vol. 29, No. 1, pp. 67-70 (Jan. 1994).

Choi, Yunho, et al., "16Mbit Synchronous DRAM with 125Mbyte/sec Data Rate," 1993 Symposium on VLSI Circuits Digest of Technical Papers, pp. 65-66, (1993).

Lee, Thomas H., et al., "A 2.5V Delay-Locked Loop for an 18Mb 500MB/s DRAM," IEEE International Solid-State Circuits Conference, Session 18, pp. 300-301 (Feb. 18, 1994).

Takai, Yasuhiro, et al., "250 Mbyte/s Synchronous DRAM Using a 3-Stage-Pipelined Architecture," *IEEE Journal of Solid-State Circuits*, vol. 29, No. 4, pp. 426-431 (Apr. 1994).

Choi, Yunho, et al., "16-Mb Synchronous DRAM with 125-Mbyte/s Data Rate," *IEEE Journal of Solid-State Circuits*, vol. 29, No. 4, pp. 529-533 (Apr. 1994).

Takai, Y., et al., "250 Mbyte/sec Synchronous DRAM Using a 3-Stage-Pipelined Architecture,"1993 Symposium on VLSI Circuits Digest of Technical Papers, pp. 59-60, (1993).

1992 Xerox Presentation re. use of on-chip DLL.

Adler, E., "The Evolution of IBM CMOS DRAM Technology," *IBM J. Res. Develop.*, vol. 39 No. 1/2, Jan./Mar. 1995, p. 169.

Anceau, "A Synchronous Approach for Clocking VLSI Systems," *IEEE Journal of Solid-State Circuits*, vol. SC-17, No. 1 (Feb. 1982).

Chen, "Designing On-Chip Clock Generators," Circuits and Devices, Jul. 1992, pp. 32-36.

Chou, Shizuo, et al., "A 60-ns 16M-bit DRAM With a Minimized Sensing Delay Caused by Bit-Line Stray Capacitance," *IEEE Journal of Solid State Circuits*, vol. 24, No. 5, Oct. 1989, pp. 1176-1178.

Foss, R.C., et al., "Application of a High-Voltage Pumped Supply for Low-Power DRAM," *IEEE 1992 Symposium on VLSI Circuits Digest of Technical Papers*, pp. 106-107.

Fujii, Syuso, et al., "A 45-ns 16-Mbit DRAM with Triple-Well Structure," *IEEE Journal of Solid-State Circuits*, vol. 24, No. 5, Oct. 1989, pp. 1170-1174.

Gasbarro, et al., "Techniques for Characterizing DRAMS With a 500 MHz Interface," International Test Conference, Oct. 1994, pp. 516-525.

Gasbarro, "Testing High Speed DRAMS," International Test Conference, Oct. 1994, p. 361.

Gillingham, Peter, et al., "High-Speed, High-Reliability Circuit Design for Megabit DRAM," *IEEE Journal of Solid-State Circuits*, vol. 26, No. 8, Aug. 1991, pp. 1171-1175.

Horowitz, Mark, "Clocking Strategies in High Performance Processors," *1992 Symposium on VLSI Circuits Digest of Technical Papers*, pp. 50-53.

Horowitz, M., et al., "PLL Design for a 500 MB/s Interface," ISSCC Digest of Technical Papers (Feb. 1993).

Johnson, et al., "A Variable Delay Line PLL for CPU-Coprocessor Synchronization," *IEEE Journal of Solid-State Circuits*, vol. 23, No. 5, Oct. 1988, pp. 1218-1223.

Kim, S., et al., "A Pseudo-Synchronous Skew-Insensitive I/O Scheme for High Bandwidth Memories," *1994 Symposium on VLSI Circuits Digest of Technical Papers*, pp. 41-42.

Menasce, V., et al., "A Fully Digital Phase Locked Loop," Canadian Conference on VLSI, Oct. 1990, pp. 9.4.1-9.4.8.

NEC, PLL Enable Mode, JC-42.3 (Sep. 14, 1994) (FIN 023321—023377).

Patent Application for Delay Locked Loop (DLL) Implementation in a Synchronous Dynamic Random Access Memory, Sep. 29, 1994 (MTI0000118755 —118768).

Przybylski, Steven, *New DRAM Technologies, A Comprehensive Analysis of the New Architectures*, MicroDesign Resources, Sebastopol, CA, (1994).

Rambus document RM 2744932-33, details Rambus making certain technical information publicly available on the internet in Nov. 1993.

Rambus Product Catalog, by Rambus, Inc., 1993.

RDRAM Reference Manual, by Rambus, Inc., 1993.

Schanke, Morten, "Proposal for Clock Distribution in SCI," May 5, 1989.

Sidiropoulos, Stefanos, et al., "A CMOS 500 Mbps/pin synchronous point to point link interface," *1994 Symposium on VLSI Circuits, Digest of Technical Papers*, pp. 43-44.

Wagner, Kenneth, et al., "Testable Programmable Digital Clock Pulse Control Elements," *International Test Conference* 1993, pp. 902-909.

Waizman, Alex, "A Delay Line Loop for Frequency Synthesis of De-Skewed Clock," *1994 IEEE Solid State Circuits Conference*, pp. 298-299.

Deposition of Thomas Vogelsang, dated Jun. 4, 2004.

MOSAID's Complaint for Patent Infringement and Jury Demand, filed Apr. 6, 2005, *Mosaid Technologies, Inc. v. Infineon North America Corp., et al*, Civil Action No. 05-00120 (E. D. TX).

Defendants' [Infineons'] Answer and Counterclaims, filed Jun. 15, 2005, *Mosaid Technologies, Inc. v. Infineon North America Corp., et al*, Civil Action No. 05-00120 (E. D. TX).

MOSAID's Reply to Infineon's Counterclaims, filed Jun. 29, 2005, *Mosaid Technologies, Inc. v. Infineon North America Corp., et al*, Civil Action No. 05-00120 (E. D. TX).

Infineon's Preliminary Invalidity Contentions Pursuant to Local Patent Rule 3-3, filed Jan. 31, 2006, *Mosaid Technologies, Inc. v. Infineon North America Corp., et al*, Civil Action No. 05-00120 (E. D. TX).

Infineon's Amended Preliminary Invalidity Contentions Pursuant to Local Patent Rule 3-3, served Feb. 7, 2006, *Mosaid Technologies, Inc. v. Infineon North America Corp., et al*, Civil Action No. 05-00120 (E. D. TX).

[MOSAID's] First Amended Complaint for Patent Infringement and Jury Demand, filed Mar. 30, 2006, *Mosaid Technologies, Inc. v. Infineon North America Corp., et al*, Civil Action No. 05-00120 (E. D. TX).

[MOSAID's] Second Amended Complaint for Patent Infringement, filed Apr. 20, 2006, *Mosaid Technologies, Inc. v. Infineon North America Corp., et al*, Civil Action No. 05-00120 (E. D. TX).

[Infineons'] Answer and Counterclaims to Second Amended Complaint, filed May 4, 2006, *Mosaid Technologies, Inc. v. Infineon North America Corp., et al*, Civil Action No. 05-00120 (E. D. TX).

Micron's Complaint for Declaratory Judgment, filed Jul. 24, 2006, *Micron Technology, Inc. v. Mosaid Technologies, Incorporated*, Civil Action No. 06-04496 (N.D.CA).

Order Granting Mosaid's Motion to Dismiss for Lack of Subject Matter Jurisdiction, entered Oct. 23, 2006, *Micron Technology, Inc. v. Mosaid Technologies, Incorporated*, Civil Action No. 06-04496 (N. D.CA).

Mosaid's Complaint for Patent Infringement, filed Jul. 25, 2006, *Mosaid Technologies, Inc. v. Micron Technology, Inc., et al.*, Civil Action No. 06-00302 (E. D. TX).

Mosaid's First Amended Complaint for Patent Infringement, filed Aug. 31, 2006, *Mosaid Technologies, Inc. v. Micron Technology, Inc., et al.*, Civil Action No. 06-00302 (E. D. TX).

Defendant Micron Technology, Inc.'s Answer to First Amended Complaint and Counterclaim, filed Oct. 25, 2006, *Mosaid Technologies, Inc. v. Micron Technology, Inc., et al.*, Civil Action No. 06-00302 (E. D. TX).

Defendant ProMos's Answer, Affirmative Defenses and Counterclaims to Mosaid's First Amended Complaint, filed Oct. 25, 2006, *Mosaid Technologies, Inc. v. Micron Technology, Inc., et al.*, Civil Action No. 06-00302 (E. D. TX).

Mosaid's Second Amended Complaint for Patent Infringement, filed Dec. 15, 2006, *Mosaid Technologies, Inc. v. Micron Technology, Inc., et al.*, Civil Action No. 06-00302 (E. D. TX).

Atsumi, Shigeru, et al., "Fast Programmable 256K Read-Only Memory with On-Chip Test Circuits," IEEE International Solid State Circuits (Feb. 1985).

Atsumi, Shigeru, et al., "A 16ns 1 Mb CMOS EPROM," IEEE International Solid States Circuits Conference (Feb. 14, 1990).

IBM Technical Disclosure Bulletin, "Positive Level-Shifting Wordline Drivers for DRAMs," vol. 33, No. 2, pp. 187-189 (Jul. 1990).

Jeung, Yeun C., "A 50Mbit/sec. CMOS Video Linestore System," SPIE vol. 1001 Visual Communications and Image Processing, pp. 362-367 (Nov. 1988).

Defendant Micron Technology, Inc.'s Answer to Second Amended Complaint and Counterclaims, filed in 06-00302, on Jan. 31, 2007.

Defendant ProMOS's Answer, Affirmative Defenses, and Counterclaims to MOSAID's Second Amended Complaint, filed in 06-00302, on Feb. 6, 2007.

Defendant Powerchip's Answer, Defenses, and Counterclaims to MOSAID's Second Amended Complaint, filed in 06-00302, on Feb. 7, 2007.

Defendant Powerchip's Amended Answer, Defenses, and Counterclaims to MOSAID's Second Amended Complaint, filed in 06-00302, on Feb. 22, 2007.

Plaintiff MOSAID Technologies, Inc.'s Reply to Counter-Plaintiff ProMOS Technologies' Counterclaims, filed in 06-00302, on Mar. 12, 2007.

Plaintiff MOSAID Technologies, Inc.'s Reply to Counter-Plaintiff Powerchip Semiconductor Corp.'s Amended Counterclaims, filed in 06-00302, on Mar. 12, 2007.

Plaintiff MOSAID Technologies, Inc.'s Reply to Counter-Plaintiff Micron Technology, Inc.'s Counterclaims, filed in 06-00302, on Mar. 23, 2007.

Defendant Mosel Vitelic, Inc.'s Answer, Affirmative Defenses and Counterclaims to MOSAID's Second Amended Complaint, filed in 06-00302, on Mar. 30, 2007.

Defendant ProMOS's Amended Answer, Affirmative Defenses, and Counterclaims to MOSAID's Second Amended Complaint, filed in 06-00302, on Apr. 10, 2007.

Plaintiff MOSAID Technologies, Inc.'s Reply to Counter-Plaintiff Mosel Vitelic, Inc.'s Counterclaims, filed in 06-00302, on Apr. 23, 2007.

Plaintiff MOSAID Technologies, Inc.'s Reply to Counter-Plaintiff ProMOS Technologies' Amended Counterclaims, filed in 06-00302, on Apr. 27, 2007.

Order Granting Micron Technology, Inc.'s Amended Motion to Dismiss its Counterclaim for Infringement of U.S. Patent No. 6,446,021, entered in 06-00302, on Jul. 10, 2007.

Notice of Service [of Defendant Powerchip's Invalidity Contentions], filed in 06-00302, on Aug. 13, 2007.

Notice of Service [of Defendant ProMOS Technologies, Inc.'s Invalidity Contentions], filed in 06-00302, on Aug. 13, 2007.

Notice of Service [of Defendant Mosel Vitelic, Inc.'s Preliminary Invalidity Contentions], filed in 06-00302, on Aug. 13, 2007.

Defendant Micron Technology, Inc.'s Notice of Compliance with P.R. 3-3 and 3-4, filed in 06-00302, on Aug. 14, 2007.

Plaintiff MOSAID Technologies, Inc.'s Sep. 5, 2007 Identification of Patent Claims, filed in 06-00302, on Sep. 5, 2007.

Tanaka, S., et al., A Programmable 256K CMOS EPROM with On-Chip Test Circuits, International Solid-State Circuits Conference (ISSCC 84), Session X: Nonvolatile Memories, THAM 10.7, pp. 148-149 (Feb. 1984).

Defendant Mosel Vitelic, Inc.'s Preliminary Invalidity Contentions, filed in *MOSAID Technologies, Inc. v. Micron Technology, Inc., et al.*, Civil Action No. 06-00302, on Aug. 13, 2007.

Defendant ProMOS Technologies, Inc.'s Preliminary Invalidity Contentions, filed in *MOSAID Technologies, Inc. v. Micron Technology, Inc., et al.*, Civil Action No. 06-00302, on Aug. 13, 2007.

Micron's Invalidity Contentions Pursuant to Patent Rule 3-3, filed in *MOSAID Technologies, Inc. v. Micron Technology, Inc., et al.*, Civil Action No. 06-00302, on Aug. 13, 2007.

Defendant Powerchip Semiconductor Corp.'s Invalidity Contentions Pursuant to Local Patent Rule 3-3, filed in *MOSAID Technologies, Inc. v. Micron Technology, Inc., et al.*, Civil Action No. 06-00302, on Aug. 13, 2007.

Stipulation Dismissing With Prejudice Claims Between Plaintiff MOSAID and Defendants ProMos and Mosel, entered in *MOSAID Technologies, Inc. v. Micron Technology, Inc.*, Civil Action No. 08-4494-JF, N.D. Cal., on Feb. 8, 2008.

Order Dismissing With Prejudice Claims Between Plaintiff MOSAID and Defendants ProMos and Mosel, entered in *MOSAID Technologies, Inc. v. Micron Technology, Inc.*, Civil Action No. 08-4494-JF, N. D. Cal., on Feb. 13, 2008.

Judgment of the U.S. Court of Appeals for the Federal Circuit reversing dismissal and remanding case back to Northern District of California in *Micron, et al. v. MOSAID Technologies, Inc.*, Civil Action No. 06-04496-JF, N.D. Cal., on Feb. 29, 2008.

Order of Court, entered on Jul. 2, 2008, in *MOSAID Technologies, Inc. v. Micron Technology, Inc., et al.*, Civil Action No. 06-00302, and dismissing Defendants' Motions to Stay and Granting Defendants' Motions to Transfer and Change Venue. Case transferred to N.D. California.

Micron's First Amended Complaint for Declaratory Judgment, filed in *Micron, et al. v. MOSAID Technologies, Inc.*, Civil Action No. 06-04496-JF, N. D. Cal., on Jul. 28, 2008.

PowerChip's First Amended Complaint in Intervention for: Declaration of Noninfringement, Invalidity, Unenforceability, and/or License, filed in *Micron, et al. v. MOSAID Technologies, Inc.*, Civil Action No. 06-04496-JF, N.D. Cal., on Aug. 12, 2008.

Mosaid's Answer, Affirmative Defenses and Counterclaims to Micron's First Amended Complaint for Declaratory Judgment, filed in *Micron, et al. v. MOSAID Technologies, Inc.*, Civil Action No. 06-04496-JF, N.D. Cal., on Aug. 14, 2008.

Mosaid's Notice of Compliance with the May 21, 2008 Order Granting Mosaid Leave to Amend and/or Supplement Preliminary Infringement Contentions, filed in *Micron, et al. v. MOSAID Technologies, Inc.*, Civil Action No. 06-04496-JF, N.D. Cal., on Aug. 25, 2008.

Mosaid's Answer, Defenses, and Counterclaims to Powerchip's First Amended Complaint in Intervention, filed in *Micron, et al. v. MOSAID Technologies, Inc.*, Civil Action No. 06-04496-JF, N. D. Cal., on Aug. 29, 2008.

Micron's Answer to MOSAID's Counterclaims, filed in *Micron, et al. v. Mosaid Technologies, Inc.*, Civil Action No. 06-04496-JF, N.D. Cal., on Sep. 8, 2008.

Powerchip's Answer to MOSAID's Counterclaims, filed in *Micron, et al. v. Mosaid Technologies, Inc.*, Civil Action No. 06-04496-JF, N.D. Cal., on Sep. 18, 2008.

Pacer Docket Report in the matter of *MOSAID Technologies, Inc. v. Micron Technology, Inc., et al.*, Civil Action No. 06-00302, showing transfer of case to Northern District of California on Oct. 7, 2008 and assignment of docket No. 08-4494.

Related Case Order relating 06-04496 (*Micron Technology, Inc. v. MOSAID Technologies, Inc.*) and 08-04494 (*MOSAID Technologies, Inc. v. Micron Technology, Inc., et al.*), entered on Oct. 15, 2008.

Stipulation Dismissing With Prejudice Claims Between Plaintiff MOSAID and PowerChip, entered in *MOSAID Technologies, Inc. v. Micron Technology, Inc.*, Civil Action No. 08-4494-JF, N.D. Cal., on Oct. 31, 2008.

Order Dismissing With Prejudice Claims Between MOSAID and PowerChip, entered in *MOSAID Technologies, Inc. v. Micron Technology, Inc.*, Civil Action No. 08-4494-JF, N.D. Cal., on Nov. 4, 2008.

Order Dismissing With Prejudice Claims Between MOSAID and PowerChip, entered in *Micron, et al. v. MOSAID Technologies, Inc.*, Civil Action No. 06-04496-JF, N.D. Cal., on Nov. 4, 2008.

Micron's Unopposed Submission of a Chart to Reflect Micron's Claim Construction Positions (and accompanying Exhibit A—Claim Construction Chart) filed in *Micron, et al. v. MOSAID Technologies, Inc.*, Civil Action No. 06-04496-JF, N.D. Cal., on Dec. 4, 2008.

Stipulation Dismissing With Prejudice Between MOSAID and Micron, filed in *Micron, et al. v. MOSAID Technologies, Inc.*, Civil Action No. 06-04496-JF, N.D. Cal., on Feb. 2, 2009.

Order Dismissng With Prejudice Claims Between MOSAID and Micron, entered in *Micron, et al. v. MOSAID Technologies, Inc.*, Civil Action No. 06-04496-JF, N.D. Cal., on Feb. 5, 2009.

Stipulation Dismissing With Prejudice Claims Between MOSAID and Micron, entered in *MOSAID Technologies, Inc. v. Micron Technology, Inc.*, Civil Action No. 08-4494-JF, N.D. Cal., on Feb. 2, 2009.

Order Dismissing With Prejudice Claims Between MOSAID and Micron, entered in *MOSAID Technologies, Inc. v. Micron Technology, Inc.*, Civil Action No. 08-4494-JF, N.D. Cal., on Feb. 5, 2009.

* cited by examiner

DELAY LOCKED LOOP IMPLEMENTATION IN A SYNCHRONOUS DYNAMIC RANDOM ACCESS MEMORY

RELATED APPLICATIONS

This application is a Continuation of application Ser. No. 10/645,330, filed Aug. 21, 2003, now U.S. Pat. No. 6,992,950 which is a Continuation of application Ser. No. 10/348,062, filed Jan. 17, 2003, now U.S. Pat. No. 6,657,919, which is a Continuation of application Ser. No. 10/279,217, filed Oct. 23, 2002, now U.S. Pat. No. 6,657,918, which is a Continuation of application Ser. No. 09/977,088, filed Oct. 12, 2001, now abandoned which is a Continuation of application Ser. No. 09/761,274, filed Jan. 16, 2001, now U.S. Pat. No. 6,314,052, which is a Continuation of application Ser. No. 09/392,088, filed Sep. 8, 1999, now U.S. Pat. No. 6,205,083, which is a Continuation of application Ser. No. 08/996,095, filed Dec. 22, 1997, now U.S. Pat. No. 6,067,272, which is a Continuation of application Ser. No. 08/319,042, filed Oct. 6, 1994, now U.S. Pat. No. 5,796,673. The entire teachings of the above applications are incorporated herein by reference.

FIELD OF THE INVENTION

This invention relates to the field of semiconductor memories, and in particular to a circuit for applying a clock to a synchronous memory such as a synchronous dynamic random access memory (SDRAM).

BACKGROUND TO THE INVENTION

An SDRAM, shown in block diagram in FIG. 1 typically operates as follows, with reference to the signal timing diagram shown in FIG. 2. A clock input terminal 1 receives a clock input signal CLK. The remainder of the SDRAM is represented by the memory array and support circuitry block 3. The clock signal arriving at the clock input terminal 1 is buffered inside the SDRAM, represented by the receiver 5 and buffer 6, and is distributed to internal circuitry of the SDRAM.

A signal at the output of the memory array and support circuitry 3 is applied to output buffers, represented by output buffer 8, which is enabled by the clock signal to drive data onto data terminals 10 of the SDRAM. However, due to the delays caused by the internal buffering and the interconnect wire on the integrated circuit chip that distributes the clock signal, the clock signal arrives at the enable terminal of the buffers delayed from the clock input signal. This delayed clock signal is illustrated in FIG. 2 as signal ICLK.

Assuming that the system is responsive to the rising edge of the clock signal, the delay between the rising edges is shown in FIG. 2 as internal clock skew 12. This clock skew can be a significant fraction of the clock period if the part is driven with a high frequency clock. The clock skew typically determines the maximum speed of the part. As the operating frequency of the part increases, as determined by the clock frequency, the clock skew delay causes enabling of the output buffer 8 too late relative to the next rising clock edge and the valid data at the output data terminals 10 will appear too late for the receiving chip.

Prior to the present invention, there we either of two solutions used to deal with this problem: (a) making the clock buffer circuitry between the clock input terminal 1 and the output buffer circuit enable terminal as fast as possible, and (b) using a phase locked loop (PLL) to drive the enable terminal of the output buffer.

Implementing the first solution results in a limit to the operating frequency of the part. There will always be a limit to the operating frequency of the part, because there will always be significant delay associated with the clock buffer and distribution circuitry and delays introduced by parasitic resistance and capacitance of the interconnection conductors used to distribute the buffered clock signal to the output buffers, which is evident from FIG. 1. Thus as shown in FIG. 2, after the read command to the memory array circuitry 3 from the address and control input of the memory array, to output data to the output buffers 8, there must be a delay 12 until valid data is output to the data terminals 10, as indicated by the timing diagram DQ. This time is the sum of the internal clock skew from the rising edge of the clock input signal CLK to the rising edge of the delayed clock signal ICLK, and the time from the rising edge of the clock signal ICLK to the time that valid data is output on the output terminals 10 caused by the output buffer delay after it has been clocked by the ICLK signal.

The second solution provides considerable improvement over the first. An on chip oscillator is used in a phase locked loop (PLL) which is synchronized with the input clock signal. The internal clock signal can be either multiplied in frequency or adjusted to remove internal clock skew as much as possible.

A system implementing the second solution is shown in FIG. 3, and a corresponding timing diagram is shown in FIG. 4. A PLL 15 is fed by the input clock signal from receiver 5, as well as by a feedback signal on conductor 17 derived from the interconnection conductor which distributes the output buffer enable clock signal. The later signal is received from the output of the PLL via the internal buffering circuitry represented by buffer 6.

Thus the already buffered (and delayed) clock signal is applied to the PLL and is compared with the input clock signal. Since the operation of the PLL is to synchronize the two signals, the clock signal to be distributed to the enable inputs of the output buffers, represented by the timing diagram ICLK in FIG. 4, is made as close as possible in timing to the input clock signal. The internal clock skew is thus minimized, as illustrated by skew time 19 shown in FIG. 4. Thus the output buffer is enabled much closer to the clock edge that is received by the part and valid data appears sooner relative to the clock edge, and thus allowing higher frequency operation of the part. This is shown by access time 21, which it may be seen is much shorter than access time 12 resulting from the first solution.

However it has been found that the PLL solution also suffers from problems. It is complex, requiring an on-chip oscillator with feedback control of the frequency depending on the monitored status of the on-chip oscillator relative to the input clock. It requires significant stand-by power due to its extra circuitry, and it requires considerable start-up time for the on-chip oscillator to synchronize and lock to the input clock frequency. It also requires use of an analog oscillator in a digital circuit, which requires significantly different and complex fabrication techniques.

SUMMARY OF THE INVENTION

The present invention minimizes the elapsed time between a clock edge that is input to a synchronous memory such as an SDRAM and the time at which the same clock edge eventually triggers the output buffer of the SDRAM to drive valid data onto the output terminals of the SDRAM. The present invention utilizes a delay locked loop (DLL) instead of the phase locked loop used in the second solution described above. The DLL allows higher clock frequency operation while requiring less standby current and start-up time than the system that uses the PLL. No oscillator is required as is required using the PLL, and the entire system can be fabricated using digital integrated circuit technology, rather than a mixture of analog and digital technology.

In accordance with an embodiment of the invention, a clock applying circuit for a synchronous memory is comprised of a clock input for receiving a clock input signal, apparatus connected to the synchronous memory for receiving a driving clock signal, and a tapped delay line for receiving the clock input signal and for delivering the driving clock signal to the synchronous memory in synchronism with but delayed from the clock input signal, the delay being a small fraction of the clock period of the clock input signal. The fraction can be negligibly small.

In accordance with another embodiment, a clock applying circuit is comprised of a synchronous dynamic random access memory (SDRAM) comprised of a memory array and an output buffer connected to the memory array, the memory array having a clock input signal terminal and the output buffer having an enable terminal for receiving a driving clock signal, a clock input For receiving a clock input signal, a tapped delay line comprised or a series of delay elements and having an input, apparatus for applying the clock input signal to the clock input signal terminal and to the input of the tapped delay line, apparatus for receiving output signals of plural ones of the delay elements and for providing one of the output signals of the delay elements as the driving clock signal, apparatus for applying the driving clock signal to the enable terminal of the output buffer, and apparatus for selecting said one of the output signals having a predetermined one of the rising and falling edge time which follows a corresponding rising or falling edge of the clock input signal by a clock skew delay time of the SDRAM between said clock input signal terminal of the memory array and the output buffer.

BRIEF INTRODUCTION TO THE DRAWINGS

A better understanding of the invention will be obtained by reading the description of the invention below, with reference to the following drawings, in which.

DETAILED DESCRIPTION OF THE INVENTION

Figure 1:
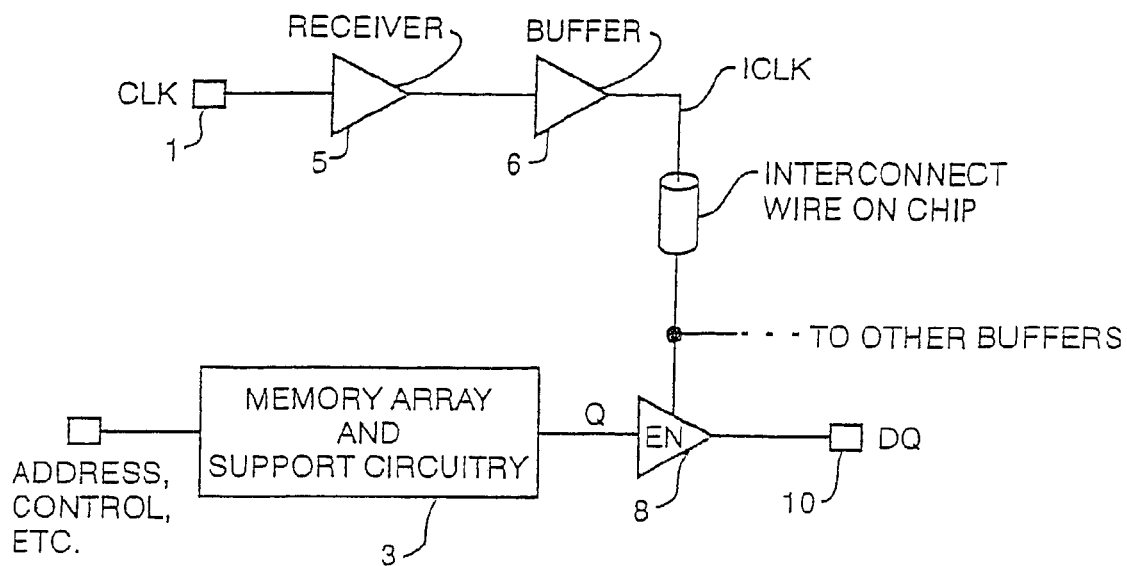
FIGS. 1 and 3 are block diagrams illustrating prior art systems.
Figure 2:
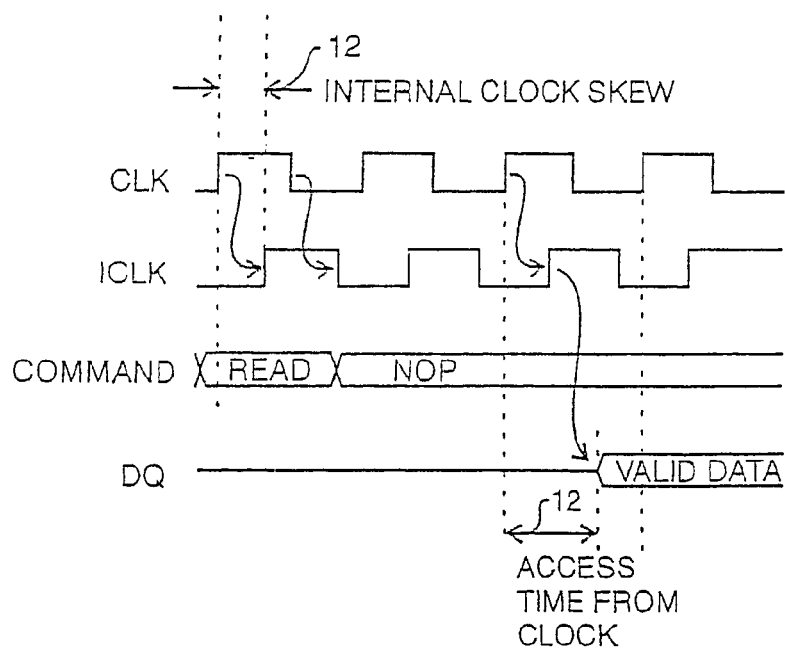
FIGS. 2 and 4 are timing diagrams corresponding to and used in understanding operation of the systems of FIGS. 1 and 3 respectively.
Figure 3:
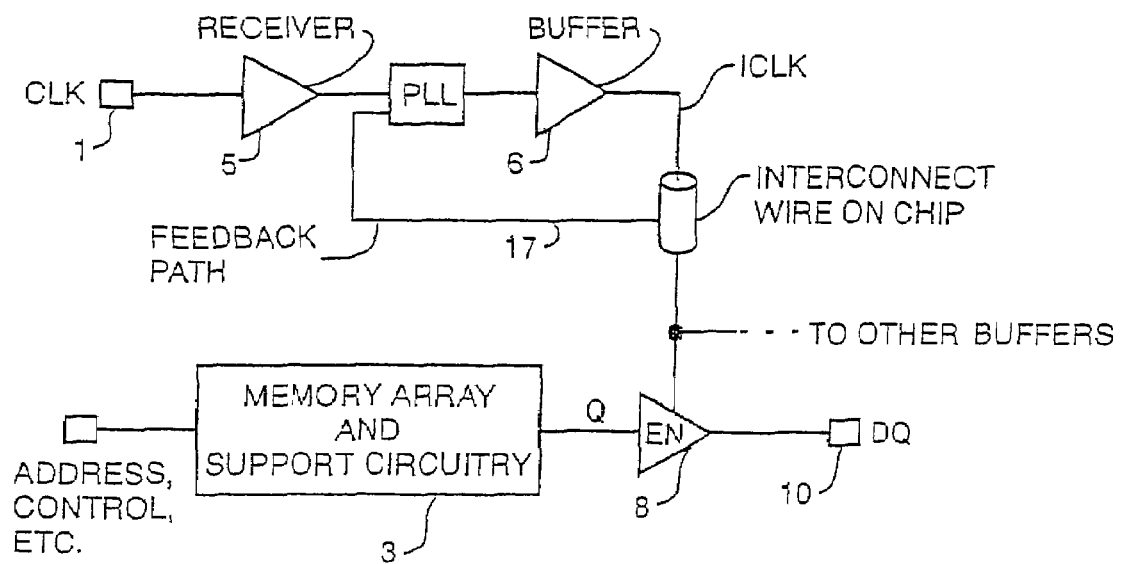
Figure 4:
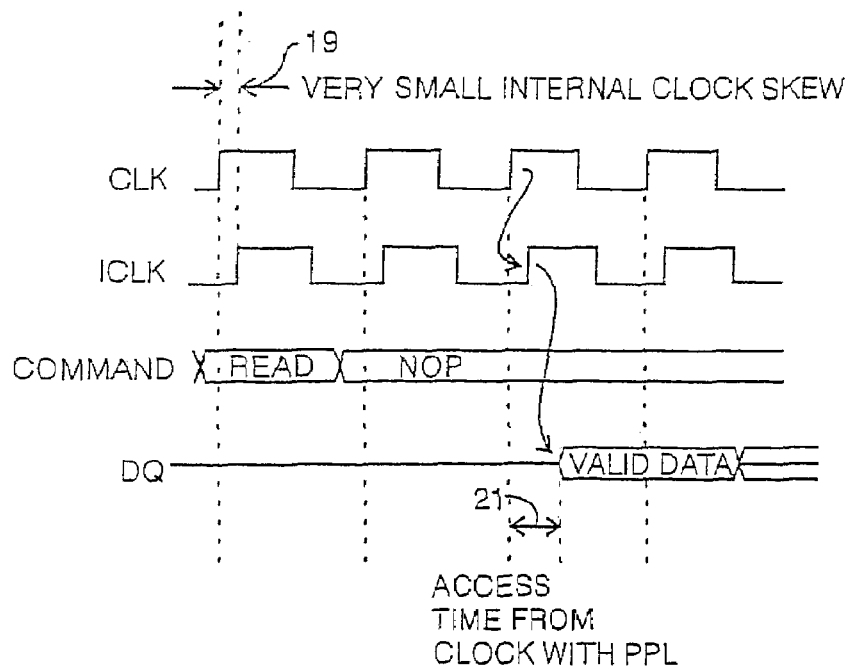
Figure 5:
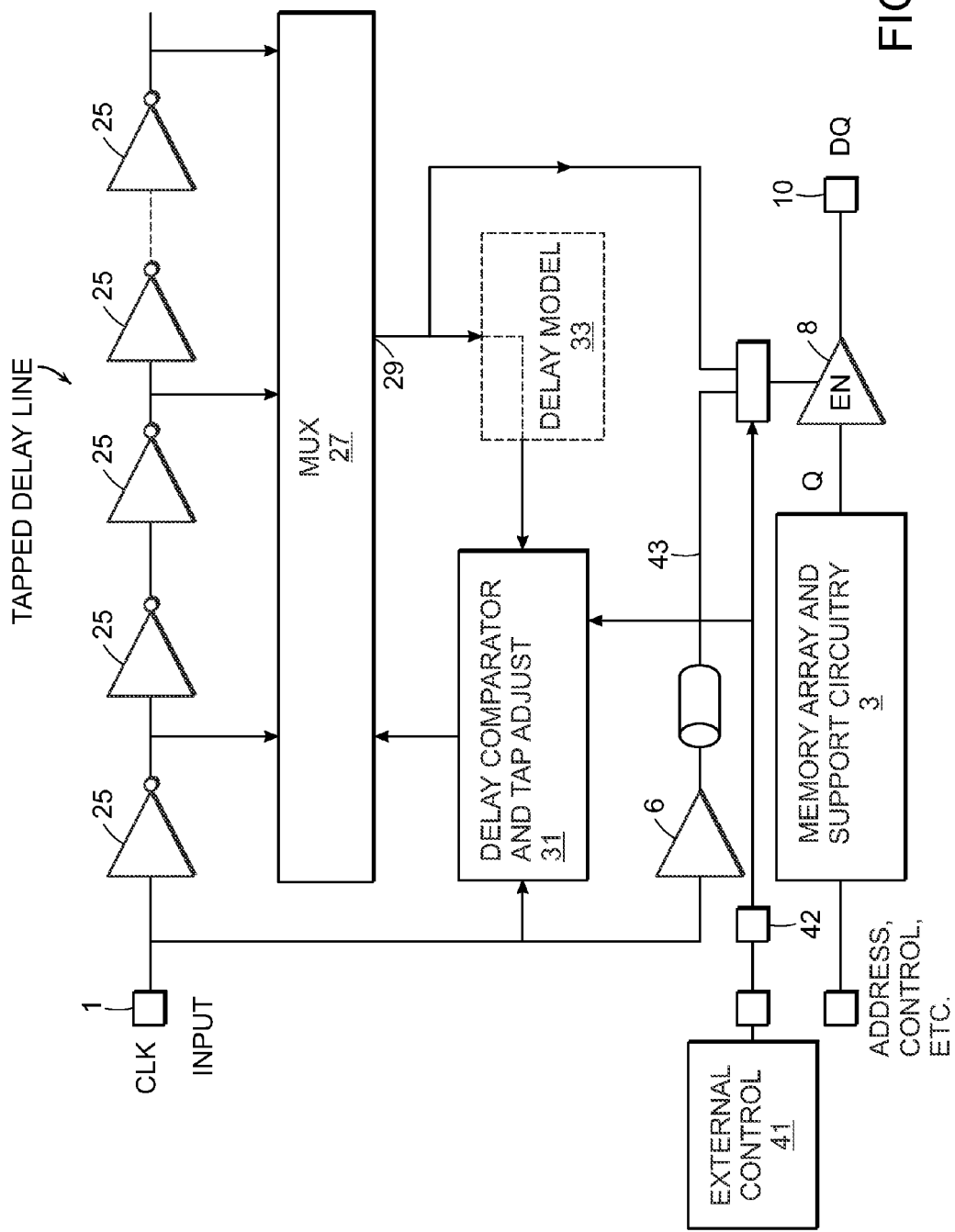
FIG. 5 is a block diagram illustrating an embodiment of the present invention.

Turning to FIG. 5, an input clock signal is applied to a tapped delay line formed of a series of delay elements 25 such as inverters. The outputs of predetermined ones of the delay elements, which can be each one of the delay elements, are provided to the inputs of a selection apparatus such as a multiplexer 27. The output of the multiplexer 29 provides a signal, referred to herein as a driving clock signal, which in this embodiment is applied to the enable terminal of the output buffer in a manner as described above with respect to the prior art systems.

A delay comparator 31 has one input that receives the input clock signal, and another input that receives the driving clock signal. The comparator 31 outputs a control signal which has a value that depends on the differential between the input clock signal and the driving clock signal. That control signal is applied to the control inputs of multiplexer 27, and determines which of the inputs to it are passed through it to output 29 and forms the driving clock signal. The value of the control signal is such that the delay between the input clock signal and the driving clock signal is minimized in the positive sense (i.e. the leading edge of the driving clock signal will always be at the same time or later than the leading edge of the input clock signal).

In this manner the output buffer of the memory will be enabled either no or a minimum time following the input clock.

In another embodiment, the feedback signal (i.e. the driving clock signal) is delayed by a delay circuit 33, referred to herein as a delay model, which use similar elements as the real circuit path taken by the input clock signal, including buffers, logic gates, interconnect conductor, etc. The result is a signal for comparison by the delay comparator 31 which is delayed by a value which tracks the real circuit's performance as operating conditions vary. It's use in a memory can allow the memory to operate at high speeds and maintains its capability as operating conditions such as temperature vary.

While the system requires some time on start-up to adapt itself to a stable operating condition, the start-up modes on most synchronous memories should be sufficient for the output buffer to receive a properly adjusted clock signal. Due to the nature of the delay locked loop, there will be a minimum frequency below which the internal function of the clock will be uncertain. If such frequencies are contemplated, external control circuitry 41 can be used to disable the delay locked loop, such as by using a register bit 42 which disables the delay locked loop. When the chip operates with the digital locked loop disabled, the start-up time and minimum frequency requirements will be ignored.

If the delay locked loop derived clock is used only for the output buffer, any chip mode registers can be set and data can be written to memory before the delay locked loop has adapted. If the chip enters a power down mode while retaining supply voltage levels, the last tap position can be preserved so that normal operation can be quickly re-enabled.

During a standby state of the memory, the delay locked loop can be disabled, and the delay chain settings can be maintained, as long as the power is applied, allowing the part to enter a low power mode. Upon exit from the standby state into an active state, the system will enter a faster lock since the delay chain settings are maintained.

The delay locked loop can be disabled and the regular buffered version of the system can be used as in the prior art, enabling the output buffer with the prior art form of delayed clock signal 43, which can allow the system to be tested or operated using a low frequency clock.

The driving clock signal can be used as the clock for the entire memory system, it can be used for only parts of the memory system and the input clock signal used for others, or can be used only to enable the output buffer with the input clock signal used for the remainder of the memory system.

The present invention is not limited for use in conjunction with an SDRAM which was used as an example, but can be used in conjunction with other synchronous memories such as synchronous static random access memories, video random access memories, synchronous graphics random access memories, synchronous read only memories. In addition, other designs of the delay locked loop may be used than the one described herein.

A person understanding this invention may now conceive of alternative structures and embodiments or variations of the above. All of those which fall within the score of the claims appended hereto are considered to be part of the present invention.

What is claimed is:

1. A synchronous dynamic random access memory (SDRAM) comprising:
   an SDRAM memory array;
   an SDRAM data output circuit;
   a clock signal; and
   a delay locked loop (DLL) having an adjustable delay line for generating a driving clock signal from the clock input signal, the driving clock signal to be applied to the SDRAM data output circuit, the adjustable delay line being a tapped delay line and the DLL being used and not used, as the clock input signal is maintained, in response to external control, wherein taps provide plural outputs of the delay line and a comparator in the DLL determined one of the tap outputs that forms the driving clock signal.

2. The SDRAM of claim 1 wherein the DLL is disabled when not used as a clock source for enabling data output.

3. A synchronous dynamic random access memory (SDRAM) comprising:
   a delay locked loop (DLL) having an adjustable delay for producing a driving clock signal in response to a clock input signal, the DLL being used and not used, as a clock source for enabling data output, as the clock input signal is maintained, in response to external control;
   an SDRAM array; and
   an SDRAM data output circuit for outputting data from the SDRAM array to an output terminal, the SDRAM data output circuit being enabled in response to the driving clock signal where the DLL is used as a clock source for enabling data output and the SDRAM data output circuit being enabled by another clock signal when the DLL is not used as a clock source for enabling data output.

4. The SDRAM of claim 3 wherein the adjustable delay comprises a tapped delay line including taps for providing plural outputs thereof.

5. The SDRAM of claim 3 wherein the DLL is a delay line and comprises a comparator for comparing the driving clock signal with the clock input signal to determine the delay by the delay line.

6. The SDRAM of claim 5 wherein the comparator is capable of minimizing the delay between the clock input signal and the driving clock signal.

7. The SDRAM of claim 3 wherein the SDRAM data output circuit is a data output buffer.

8. The SDRAM of claim 3 wherein the external control is provided by a bit having two logic states, one of the two states causing the DLL to be not used as a clock source for enabling SDRAM the data output circuit.

9. The SDRAM of claim 3 wherein settings of the adjustable delay are maintained when the delay locked loop is not used as a clock source for enabling data output.

10. The SDRAM of claim 3 wherein the another clock signal is a buffered version of the clock input signal.

11. A method of providing a clock to a synchronous dynamic random access memory (SDRAM) comprising:
    generating a driving clock signal in the SDRAM from a clock input signal through a delay locked loop (DLL) having an adjustable delay line, the adjustable delay line being a tapped delay line; and
    using external control, discontinuing use of the delay locked loop as the clock input signal is maintained,
    wherein taps of the tapped delay line provide plural outputs of the delay line and one of the tap outputs is determined by a comparator in the DLL to form the driving clock signal.

12. A method of providing a clock to a synchronous dynamic random access memory (SDRAM), the method comprising:
    providing a driving clock signal in response to a clock input signal through a delay locked loop (DLL) having an adjustable delay;
    enabling an SDRAM data output circuit with the driving clock signal to output data from an SDRAM array to an output terminal; and
    using external control, discontinuing use of the DLL as a clock source for enabling SDRAM the data output circuit, as the clock input signal is maintained, and enabling the SDRAM data output circuit with another clock signal.

13. The method of claim 12 wherein the adjustable delay comprises a tapped delay line having taps, the step of providing comprising providing plural outputs from taps of the tapped delay line.

14. The method of claim 12 wherein the adjustable delay is a delay line and the step of providing further comprises comparing the driving clock signal with the clock input signal to determine the adjusted delay by the delay line.

15. The method of claim 14 wherein the step of comparing comprises minimizing the delay between the clock input signal and the driving clock signal.

16. The method of claim 12 wherein the SDRAM data output circuit is a data output buffer.

17. The method of claim 12 wherein the external control is based on a condition of the SDRAM.

18. The method of claim 12 wherein the external control is applied during a start-up of the DLL.

19. The method of claim 12 wherein the external control is provided in response to a bit having two logic states, one of the two states causing the DLL to be not used as a clock source for enabling SDRAM the data output circuit.

20. The method of claim 12 wherein settings of the adjustable delay are maintained when the delay locked loop is not used as a clock source for enabling the SDRAM data output circuit.

21. The method of claim 12 wherein the another clock signal is a buffered version of the clock input signal.

22. The method of claim 12 wherein the DLL is disabled when its use is discontinued.

* * * * *

UNITED STATES PATENT AND TRADEMARK OFFICE
CERTIFICATE OF CORRECTION

PATENT NO. : 7,599,246 B2
APPLICATION NO. : 11/195257
DATED : October 6, 2009
INVENTOR(S) : Richard C. Foss, Peter B. Gillingham and Graham Allan It is certified that error appears in the above-identified patent and that said Letters Patent is hereby corrected as shown below:

In Claim 1, Column 5, line 9, between "clock" and "signal" insert --input--;
In Claim 1, Column 5, line 18, delete "determined" and insert --determines--.

Signed and Sealed this

Twenty-fourth Day of November, 2009

David J. Kappos
*Director of the United States Patent and Trademark Office*